(12) United States Patent
Saito

(10) Patent No.: US 7,709,103 B2
(45) Date of Patent: May 4, 2010

(54) PHOSPHOR, MANUFACTURING METHOD THEREOF AND LIGHT EMITTING DEVICE USING THE SAME

(75) Inventor: Hajime Saito, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 1196 days.

(21) Appl. No.: 11/243,962

(22) Filed: Oct. 6, 2005

(65) Prior Publication Data

US 2006/0076878 A1   Apr. 13, 2006

(30) Foreign Application Priority Data

Oct. 8, 2004 (JP) .............................. 2004-296444

(51) Int. Cl.
*C09K 11/62* (2006.01)
*C09K 11/64* (2006.01)
*C30B 29/38* (2006.01)
*C01B 21/06* (2006.01)

(52) U.S. Cl. ........................ 428/690; 428/357; 977/762; 977/816; 977/848; 313/483; 372/68; 372/66; 372/43.01; 117/87; 117/107

(58) Field of Classification Search ................ 428/690, 428/357; 977/762, 816, 949; 372/68, 66, 372/43.01; 313/483; 117/87, 105

See application file for complete search history.

(56) References Cited

U.S. PATENT DOCUMENTS 7,132,677 B2 * 11/2006 Kim et al. ...................... 257/14
2004/0213307 A1 * 10/2004 Lieber et al. ................... 372/39

FOREIGN PATENT DOCUMENTS

| JP | 2000-8035 A | 1/2000 |
|---|---|---|
| JP | 2000-315653 A | 11/2000 |
| JP | 2002-241929 A | 8/2002 |
| JP | 2003-34510 A | 2/2003 |
| JP | 2003-63810 A | 3/2003 |
| JP | 2003-226521 A | 8/2003 |
| JP | 2003-347585 A | 12/2003 |

OTHER PUBLICATIONS

Kawal et al., "Epitaxial Growth of InN Films and InN Nano-Columns by RF-MBE," The Institute of Electronics, Information and Communication Engineers Technical Report of IEICE, vol. 103, No. 343, pp. 33-37, (2003).
He et al., "Formation of columnar (In, Ga) As quantum dots on GaAs (100)," Applied Physics Letters, vol. 85, No. 14, pp. 2771-2773, (2004).
Asahi et al., "Quantum Structures Self-Formed in GaP/InP Short Period Superlattices," Journal of the Surface Science Society of Japan, vol. 19, No. 9, pp. 565-572, (1998).
ISOBE, Applied Physics, vol. 70, No. 9, pp. 1087-1091, 2001.

* cited by examiner

*Primary Examiner*—C. Melissa Koslow
(74) *Attorney, Agent, or Firm*—Birch, Stewart, Kolasch & Birch, LLP

(57) ABSTRACT

The present invention provides a nano particle phosphor with superior luminous characteristic formed using nitride semiconductor material, a method of manufacturing the phosphor with high production yield, and a light emitting device using the phosphor. The phosphor is formed of a columnar crystal having a diameter of at most 3 nm, a light emitting region and a light absorbing region are defined in the columnar crystal, and the light emitting region and the light absorbing region are adjacent to each other along a longitudinal direction of the columnar crystal.

12 Claims, 3 Drawing Sheets

PHOSPHOR, MANUFACTURING METHOD THEREOF AND LIGHT EMITTING DEVICE USING THE SAME

This nonprovisional application is based on Japanese Patent Application No. 2004-296444 filed with the Japan Patent Office on Oct. 8, 2004, the entire contents of which are hereby incorporated by reference.

BACKGROUND OF THE INVENTION

1. Field of the Invention

The present invention relates to crystalline phosphor (fluorescent body) having a columnar shape, manufacturing method thereof and a light emitting device using the phosphor.

2. Description of the Background Art

Recently, phosphors using semiconductor crystals as matrix have been vigorously studied. Particularly, nano-size particle phosphors having luminous efficiency enhanced by quantum size effect have been much developed. Particularly, practical application of ZnS and CdSe, which are II-VI group compound semiconductors, as phosphor materials have been steadily studied, as these materials can be synthesized at a room temperature and nano-particles of uniform size can be synthesized in large amount by coprecipitation, reversed micelle method or the like, as described in ISOBE Tetsuhiko, "High Efficiency of Luminescence on Nanosized Phosphors" Applied Physics, Vol. 70, No. 9, pp. 1087-1091 (2001).

Nano-particle phosphors, however, tend to aggregate, and when specific surface area increases, luminescent killers derived from surface defects increase, degrading light emitting characteristic. In view of this problem, Japanese Patent Laying-Open No. 2003-226521 discloses a technique in which the surface of nano-particles is modified by a surface stabilizer, to attain the effect of defect capping and monodispersity.

On the other hand, nitride semiconductors such as GaN, InN and AlN, which are III-V group compound semiconductors, have superior light emitting characteristic and have been known as materials of light emitting device emitting blue-violet light of high luminance. A technique for manufacturing a phosphor using the nitride semiconductor as such has been proposed recently, as disclosed in Japanese Patent Laying-Open Nos. 2000-008035, 2003-034510 and 2003-063810.

The nitride semiconductor, however, is a chemically stable compound, and therefore, synthesis thereof requires high reaction temperature. Synthesis by reversed micelle method disclosed in ISOBE reference above or surface modification using a stabilizer disclosed in Japanese Patent Laying-Open No. 2003-226521 cannot be applied, as these methods employ materials that are much susceptible to pyrolysis.

By the methods disclosed in Japanese Patent Laying-Open Nos. 2000-008035, 2003-034510 and 2003-063810, it is impossible to obtain phosphor particles that can attain quantum size effect (specifically, particles smaller than twice Bohr radius). Particularly, in a method of obtaining phosphor particles by hetero-epitaxial growth of semiconductor around nuclear particles, crystal tends to grow in a specific orientation, and therefore, uniformly coated phosphor particles unavoidably come to have large diameter. Physical grinding of particles or surface modification by post processing can not remarkably improve luminous efficiency, while manufacturing process is troublesome and costly.

As described above, conventional nitride phosphors and manufacturing methods thereof cannot efficiently provide nano-particle phosphors having superior luminous efficiency.

The present invention was made in view of the conventional technical problems described above, and its object is to provide a phosphor having superior light emitting characteristic using nitride semiconductor material, a manufacturing method that can produce the phosphor with high production yield, and a light emitting device using the same.

SUMMARY OF THE INVENTION

The present invention provides a phosphor formed of a columnar crystal having a diameter of at most 3 nm, wherein a light emitting region and a light absorbing region are defined in the columnar crystal, and the light emitting region and the light absorbing region are adjacent to each other along a longitudinal direction of the columnar crystal.

Preferably, the light emitting region has a length of at most 3 nm.

Preferably, the light emitting region is posed between the light absorbing regions.

Preferably, there are two or more said light emitting regions.

Preferably, the light emitting region includes a light emitting region of red, a light emitting region of green and a light emitting region of blue, and provides white light as a whole as red, green and blue are mixed.

Preferably, the columnar crystal includes a III group nitride, and the crystal has wurtzeit structure.

Preferably, a plane including the diameter of the columnar crystal is (0001) plane, and the longitudinal direction is <0001> direction.

Preferably, a luminescence center is added to the light emitting region.

Preferably, the luminescence center is a rare earth element.

Preferably, an element that controls light absorption is added to the absorbing region.

Further, the present invention provides a method of manufacturing a phosphor, including the steps of: forming a dielectric thin film on a substrate; growing a phosphor of columnar crystal on the dielectric thin film; and removing the phosphor of columnar crystal from the substrate by etching.

Preferably, the dielectric film is silicon nitride or silicon oxide.

Further, the present invention provides a light emitting device, having any of the above-described phosphors arranged side by side in a prescribed density on a substrate.

The phosphor in accordance with the present invention attains good luminous efficiency and high intensity. The method of manufacturing the phosphor in accordance with the present invention enables manufacturing with high production yield. Further, the light emitting device in accordance with the present invention attains improved luminous efficiency as compared with a light emitting body formed in a planar shape.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The phosphor of the present invention is characterized in that it is formed of a columnar crystal having a diameter of at most 3 nm, a light emitting region and a light absorbing region are defined in the columnar crystal, and the light emitting region and the light absorbing region are adjacent to each other along a longitudinal direction of the columnar crystal. As the columnar crystal is adapted to have the diameter of 3 nm or smaller, luminous efficiency can remarkably be enhanced because of quantum size effect. Further, degradation of luminous efficiency resulting from internal field can be prevented. In addition, small diameter of at most 3 nm enables fine emission pattern, and therefore, a display or white light illumination using the phosphor of the present invention is free from color irregularity. More preferable diameter is 2.5 nm.

In the phosphor of the present invention, the columnar crystal consists of a crystal grown in a columnar shape in a specific direction from a nano-size small area as a cross section vertical to the longitudinal direction. The columnar crystal is provided with a light absorbing region and a light emitting region adjacent thereto. Here, the light absorbing region refers to a region that absorbs light, and by appropriately designing the material of the light absorbing region, wavelength of light to be absorbed can be adjusted. The light emitting region refers to a region that converts energy transmitted from the light absorbing region to light to be emitted externally. The color of light emission may be adjusted by varying the material of the light emitting region.

Figure 1:
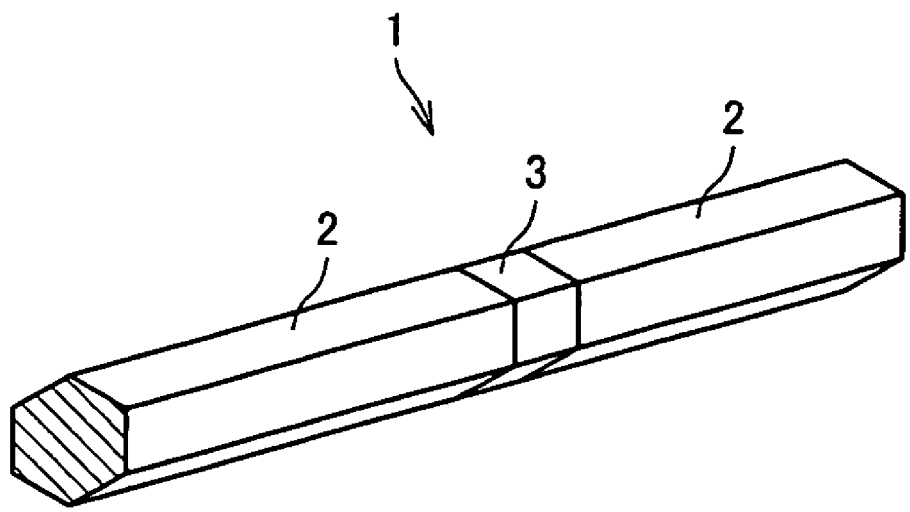
FIG. 1 is a schematic perspective view showing the phosphor in accordance with the present invention.

The phosphor of the present invention will be described with reference to the figures. FIG. 1 is a schematic perspective view of the phosphor in accordance with the present invention. Referring to FIG. 1, a phosphor 1 is formed of a columnar semiconductor single crystal having the diameter of at most 3 nm, as described above. Phosphor 1 includes light absorbing regions 2 and a light emitting region 3 positioned therebetween.

In the present invention, the semiconductor material forming phosphor 1 is preferably the III group nitride semiconductor such as GaN, AlN, InN or a mixed crystal of these. These semiconductor materials are direct transition type, wide gap semiconductors that can attain emission of RGB (red, green and blue) necessary to provide various colors of emission.

In the present invention, preferably, light emitting region 3 has the diameter and length both of at most 3 nm. When the size exceeds 3 nm, quantum size effect decreases, and the shielding effect of internal field increases considerably, so that luminous efficiency lowers. When the size is made 3 nm or smaller, significant quantum size effect can be attained, resulting in higher luminous efficiency. The diameter and length of the light emitting region are measurements of the cross-sectional diameter and the longitudinal length of the columnar crystal. These can be measured by using a scanning electron microscope, observing the cross section and side surface of the shape of columnar crystal.

In addition to a conventional light source emitting ultraviolet ray (defined here as 200 to 380 nm), a light source of blue-violet (defined here as 380 to 450 nm) may be used as the excitation source exciting the phosphor of the present invention. Among others, a blue-violet semiconductor light emitting device using III group nitride semiconductor is preferred, as it has superior luminous efficiency and power saving characteristic, and allows reduction in size and weight.

In order to absorb the excitation light of ultraviolet to blue-violet range, preferably, light absorbing region 2 should be adjusted to have the band gap of 2.5 eV to 6.5 eV. As a semiconductor material that allows such band gap control, use of $Al_xGa_{1-x}N$ ($0 \leq x \leq 1$) or $In_yGa_{1-y}N$ ($0 \leq y \leq 0.15$) mixed crystal is preferred.

By way of example, when an ultraviolet light source having the wavelength of 300 nm is used as the excitation light, the excitation light of this wavelength can be absorbed if the band gap of light absorbing region 2 is smaller than 4.1 eV. Therefore, it is preferred that light absorbing region 2 is formed of $Al_xGa_{1-x}N$ of which Al composition ratio x is at most 0.3.

When a blue-violet light source having the wavelength of 405 nm is used as the excitation light, the excitation light of this wavelength can be absorbed if the band gap of light absorbing region 2 is smaller than 3.0 eV. Therefore, it is preferred that light absorbing region 2 is formed of $In_yGa_{1-y}N$ of which In composition ratio y is at least 0.08.

When the phosphor of the present invention is used to attain white light emission by mixing RGB, it is preferred that blue component (4350 to 480 nm) is not absorbed, in order to attain emission of white light with high color rendering characteristic. Thus, light absorbing region 2 should preferably have the band gap larger than 2.75 eV that corresponds to the wavelength of 450 nm. Specifically, when light absorbing region 2 is formed of $In_yGa_{1-y}N$, In composition ratio y should be at most 0.15.

The diameter and length of light absorbing region 2 may be larger to absorb larger amount of light. However, the size of phosphor increases as its volume increases, and fine light emission becomes difficult. Therefore, the length of light absorbing region should preferably be adjusted such that the length of phosphor 1 in the longitudinal direction is at most 1 μm. The diameter and length of the light absorbing region can be measured in the similar manner as those of the light emitting region described above.

In the present invention, preferably, light emitting region 3 is sandwiched between light absorbing regions 2, as shown in FIG. 1. Specifically, light emitting region 3 is preferably sandwiched between two light absorbing regions 2 along the longitudinal direction of phosphor 1. As opposite surfaces of light emitting region 3 vertical to the longitudinal direction are in contact with light absorbing regions 2, energy transfer efficiency improves, and in addition, surface defects can be reduced. Thus, higher luminous efficiency can be attained.

Figure 2:
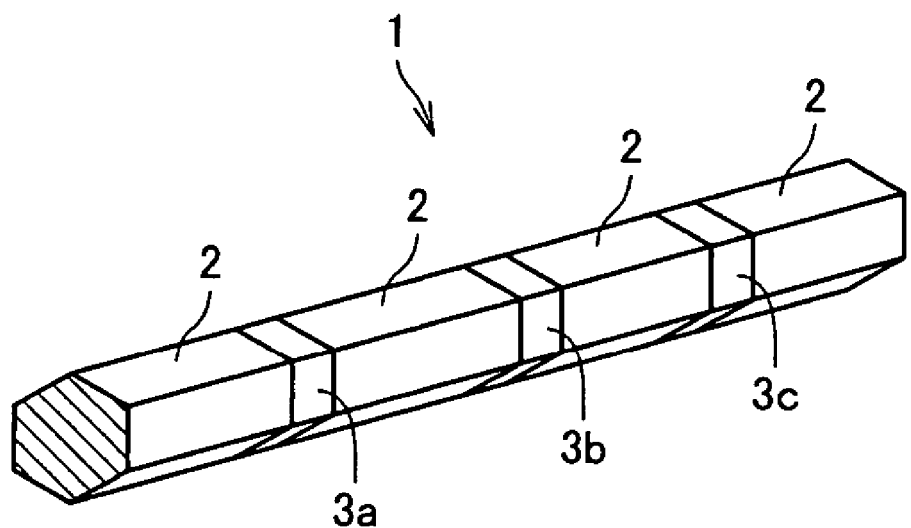
FIG. 2 is a schematic perspective view showing the phosphor in accordance with the present invention.

Further, in the present invention, there may be two or more light emitting regions 3 in the columnar crystal forming phosphor 1, as shown in FIG. 2. Further, two or more light emitting regions 3 may emit light of different wavelength. In the example shown in FIG. 2, there are three light emitting regions 3, and therefore, there are four light absorbing regions 2 between which light emitting regions 3 are interposed.

By providing two or more light emitting regions 3 in phosphor 1, the energy in light absorbing regions can be transferred without waste to light emitting regions 3. Further, by providing a plurality of light emitting regions 3, it becomes possible to emit light of different colors from one phosphor. Particularly, when light emitting regions emitting light of three primary colors, that is, red, green and blue, are provided, these colors are mixed and white light can be emitted from one phosphor 1. Therefore, troublesome arrangement of a plurality of phosphors becomes unnecessary, manufacturing cost can be reduced, and the phosphor of white having high cost-efficiency can be provided.

For good visibility and superior color rendering characteristic when white light emission is attained, preferably, the wavelength of light from the phosphor is as follows: for red light emission, the peak wavelength should preferably be in the range of 600 to 670 nm; for green light emission, the peak wavelength should preferably be in the range of 500 to 550 nm; and for blue light emission, the peak wavelength should preferably be in the range of 450 to 480 nm.

When there are a plurality of light emitting regions which emit light beams of different wavelength as described above, a number of methods may be employed for controlling emission wavelength. By way of example, substantial band gap may be changed by controlling composition ratio of the light emitting regions.

As the III group nitride semiconductor for obtaining the preferable peak emission wavelength described above, $In_zGa_{1-z}N$ ($0 \leq z \leq 1$) mixed crystal is preferred, which allows good control of the RGB peak emission wavelength mentioned above.

Alternatively, an impurity may be added so that the wavelength is controlled by emission through the impurity. Assuming that a III group nitride semiconductor material is used as the columnar crystal phosphor, the impurity for that purpose may include Si as a donor and Zn or Mg as an acceptor.

The level attained by a donor impurity is shallower than the band gap, and therefore, it can be used for fine control of the peak emission wavelength from the band gap. On the contrary, an acceptor level is deeper than the donor level, and therefore, it can much vary the peak emission wavelength.

Control of the peak emission wavelength by adding a luminescence center that emits light by inner shell transition is preferred, as it attains higher luminous efficiency than interband transition or transition made through impurity level described above, and further, fluctuation of emission wavelength caused dependent on temperature or excitation condition is smaller. A rare earth element is suitable for such luminescence center, and specific example includes Nd, Sm, Eu, Gd, Tb, Dy and Yb.

When emission is attained utilizing inner shell transition, the peak emission wavelength is determined not by the band gap of III group nitride semiconductor as the matrix but by the type and ionic charge number of the rare earth element. In order to attain the preferable peak emission wavelength mentioned above, $Sm^{3+}$ and $Eu^{3+}$ are most preferred for red phosphor, $Tb^{3+}$ and $Eu^{2+}$ are most preferred for green phosphor, and $Ce^{3+}$ and $Tm^{3+}$ are most preferred for blue phosphor.

In the present invention, the absorbing wavelength may also be controlled by adding an impurity to light absorbing region 2. The above-described donor/acceptor impurities and rare earth luminescence center may be used as the absorbing impurity.

Phosphor 1 of the present invention has wurtzeit crystal structure, and assuming that the longitudinal direction is the <0001> direction, preferably, a cross section cut along the plane vertical to that direction is the (0001) plane of the wurtzite structure. This facilitates formation of columnar crystal as the <0001> direction is along an axis allowing easy orientation, and columnar phosphors of uniform diameter can easily be manufactured.

Specifically, the cross-sectional shape of phosphor 1 has an almost hexagonal shape reflecting the wurtzeit crystal structure, and the cross section has the crystal face of (0001). The longitudinal direction is the <0001> direction vertical thereto. The semiconductor materials mentioned above used for phosphor 1 all include the wurtzeit crystal structure, and grow stably oriented along the <0001> direction from the (0001) face. Therefore, a columnar crystal can easily be formed as the phosphor of the present invention. The cross-sectional shape can be confirmed by using a scanning electron microscope, observing the cross section and side surface of the shape of columnar crystal.

Next, the method of manufacturing the phosphor of the present invention will be described. The method of manufacturing the phosphor of the present invention includes the steps of forming a dielectric thin film on a substrate, growing a columnar crystalline phosphor on the dielectric thin film, and removing said columnar crystalline phosphor from the substrate by etching.

Thus, a columnar crystal having a specific orientation can be epitaxially grown from a crystal nucleus in the form of dielectric thin film. Further, in the step of removing the phosphor from the substrate, the phosphor is removed by etching. Therefore, a small phosphor formed of the columnar crystal can be removed easily. The method of manufacturing the phosphor of the present invention will be described with reference to the figures.

FIGS. 3A to 3F are schematic cross sections showing process steps of manufacturing the phosphor in accordance with the present invention.

Figure 3A:
FIGS. 3A to 3F are schematic cross sections representing process steps of manufacturing the phosphor in accordance with the present invention.
Figure 3B:
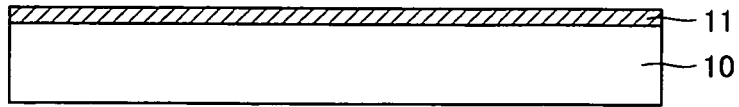

First, as shown in FIG. 3A, a substrate 10 is prepared and, as shown in FIG. 3B, a dielectric film 11 is formed on the surface of substrate 10. Preferable substrate material includes Si substrate of (111) plane, sapphire substrate of (0001) plane, and SiC substrate of (0001) or (111) plane. Preferably, the thickness of substrate 10 is at least 100 μm and smaller than 1 mm. When it exceeds 1 mm, it is too thick and degrades conduction of heat from the rear surface of substrate, possibly making it difficult to control growth temperature in the step of growing columnar crystal that will be described later. When it is thinner than 100 μm, it is too thin and fragile, so that production yield in the manufacturing process might decrease significantly.

As dielectric film 11, silicon oxide ($SiO_2$) or silicon nitride ($Si_3N_4$) is preferred. When Si or SiC substrate is used as substrate 10, the dielectric thin film may be formed by oxidizing or nitriding the substrate surface. When a sapphire substrate is used, such a dielectric film can be formed by a known method of thin film formation such as sputtering, CVD method or EB deposition. Preferably, the thickness of dielectric film is at least 1 nm and smaller than 100 μm. If it exceeds 100 μm, it is too thick and removal by selective etching, which will be described later, becomes difficult, possibly damaging the columnar crystal in the step of removing the columnar crystal from the dielectric film. If it is smaller than 1 nm, it is too thin and uniform formation of the dielectric film becomes difficult, so that it becomes difficult to have the crystal nuclei grown on the dielectric film in a desired orientation.

In this manner, as silicon nitride or silicon oxide is used as the dielectric, the columnar phosphor can easily be removed from the substrate of epitaxial growth, and a very small phosphor formed of a columnar crystal can easily be obtained.

Figure 3C:
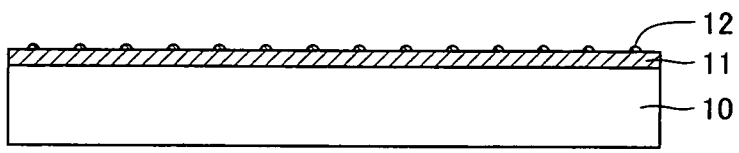

Next, as shown in FIG. 3C, a crystal nuclei 12 are formed on dielectric film 11. By using molecular beam epitaxy (MBE) method, chemical vapor deposition (CVD) method or pulse laser deposition (PLD) method as the method of forming crystal nuclei 12, the crystal nuclei can be obtained in self-forming manner, in an initial stage of crystal growth.

Figure 3D:
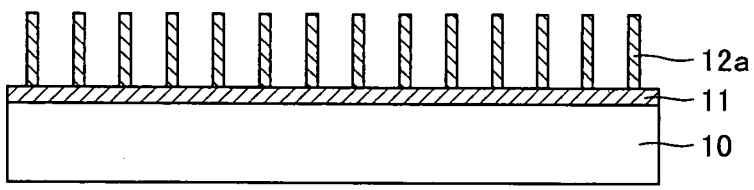

Thereafter, as shown in FIG. 3D, crystal nuclei 12 are grown to obtain a light absorbing region 12a formed of a columnar crystal. Probability that a semiconductor material adheres on dielectric film 11 is low, and therefore, substrate 10 is dotted with crystal nuclei 12 of a prescribed density. The following growth is oriented along a specific direction with each crystal nucleus 12 as the center, and therefore, columnar crystals such as shown in FIG. 3D can easily be grown.

Figure 3E:
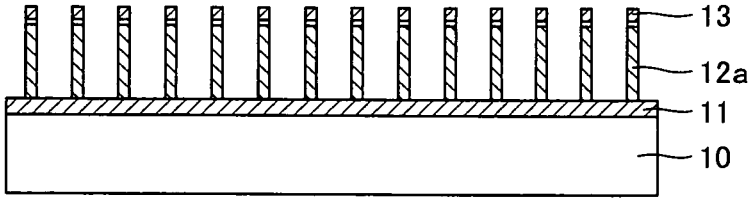
Figure 3F:
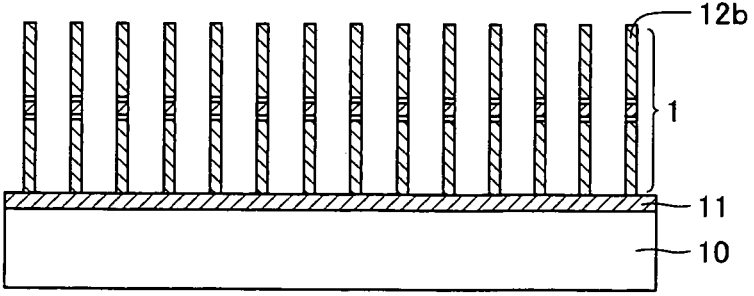

Next, as shown in FIG. 3E, the condition of crystal growth is changed to form a light emitting region 13 on light absorbing region 12a. Thereafter, as shown in FIG. 3F, the condition of crystal growth is changed again, to form a light absorbing region 12b on light emitting region 13.

Through the above-described steps, phosphors 1 of columnar crystal consisting of light absorbing region 12 and light emitting region 13 are formed side by side on substrate 10. As for the method of crystal growth, molecular beam epitaxy (MBE) method, chemical vapor deposition (CVD) method, pulse laser deposition (PLD) method or the like may be used.

Thereafter, in order to remove phosphor 1, dielectric film 11 is eliminated using an etchant that selectively etches dielectric film 11 only, and phosphor 1 is removed from substrate 10 (not shown). Phosphor 1 of the present invention is obtained through these steps.

When dielectric film 11 is formed of silicon oxide or silicon nitride, a solution containing hydrogen fluoride (HF) is preferably used as the etchant, as it etches away only the dielectric film, without any influence on substrate 10 or phosphor 1.

Figure 4:
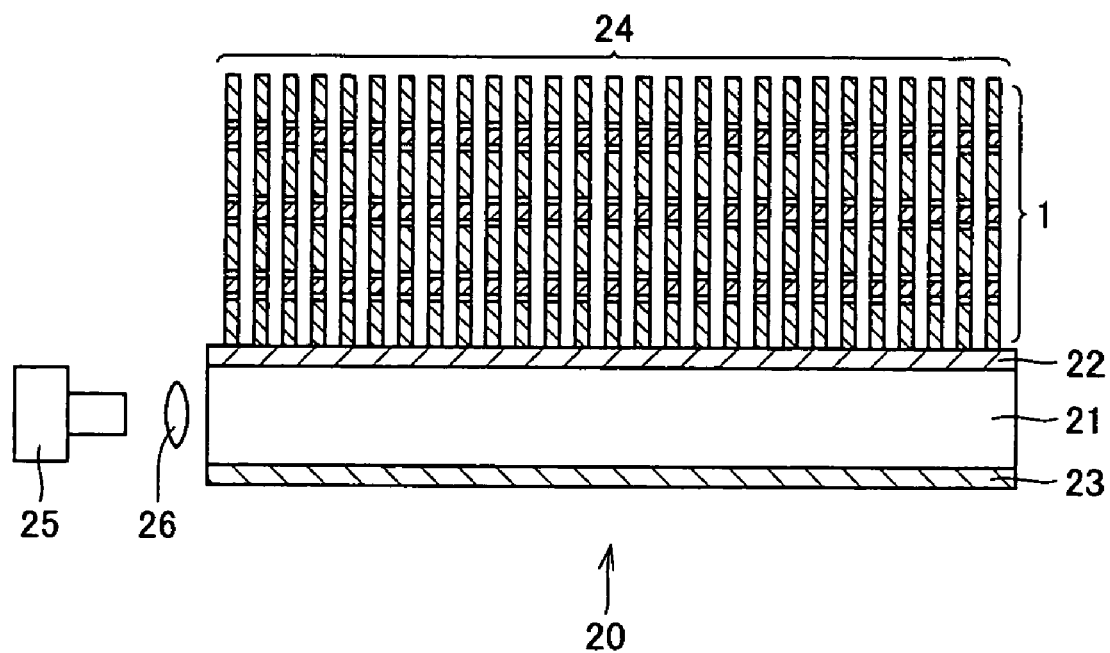
FIG. 4 is a schematic cross section showing the light emitting device in accordance with the present invention.

Phosphor 1 of the present invention may be used for a light emitting device. The light emitting device of the present invention is characterized in that the phosphors described above are arranged aligned on a substrate in a prescribed density. As the columnar phosphors grown on a substrate are arranged side by side in a prescribed density, the substrate can be used as an excitation light introducing portion to the columnar phosphor, and as the columnar phosphor is integral with the substrate, coupling loss is small. Therefore, a highly efficient light emitting device can be obtained. FIG. 4 is a schematic cross section of the light emitting device in accordance with the present invention.

A light emitting device 20 in accordance with the present invention has a group of phosphors of columnar crystals grown on a substrate 21 with a dielectric film 22 interposed, in accordance with the method of manufacturing the phosphor described above, which group of phosphors 24 are not removed from the substrate but excited by irradiation from an excitation source 25 from a side surface of the substrate. As compared with a surface emitting type light emitting device having a light emitting region in the form of a thin film, luminous efficiency of phosphor is higher in light emitting device 20 of the present invention, and therefore, a light emitting device attaining higher luminance and higher efficiency can be obtained. Further, compared with a conventional example in which a phosphor plane having particles of phosphors dispersed thereon is provided, coupling loss is small as the columnar phosphor is integral with the substrate serving as the light introducing portion. Thus, a surface emitting type light emitting device with high efficiency can be realized.

Between excitation source 25 and a side surface of substrate 21, a lens 26 may be interposed for improved coupling efficiency. Further, in order to efficiently introduce the excitation light incident on substrate 21 to the inside of phosphor group 24 of columnar crystals, a light reflecting plate 23 may be provided below substrate 21. As light reflecting plate 23, material such as aluminum (Al), silver (Ag), platinum (Pt) or the like may be used.

In the following, the present invention will be described in detail with reference to examples, which are not intended to limit the scope of the invention.

FIRST EXAMPLE

In the present example, a phosphor consisting of a columnar crystal formed using a III group nitride semiconductor and an exemplary manufacturing method thereof will be described.

Referring to FIGS. 3A to 3F, an Si wafer material having the (111) plane as a main surface was used as a substrate 10, and an $SiO_2$ film having the thickness of 10 nm was formed by thermal oxidation for 3 hours at 900° C. in an oxygen atmosphere. The $SiO_2$ film serves as the dielectric film 11.

Thereafter, substrate 10 was introduced to a molecular beam epitaxy apparatus (not shown), and substrate 10 was irradiated with beams of metal Ga, metal In and active atomic N, which had been turned to plasma, to form crystal nuclei 12 of $In_{0.1}Ga_{0.9}N$. Crystal nucleus 12 was observed by a scanning electron microscope, and it was confirmed that the surface had a hexagonal shape and the diameter was 2.5 nm.

After further growth, crystal nucleus 12 became a columnar crystal of $In_{0.1}Ga_{0.9}N$ having the length of 20 nm. The columnar crystal region corresponds to light absorbing region 12a.

Then, intensity of molecular beams of metal Ga and metal In was adjusted, to grow light emitting region 13 of $In_{0.2}Ga_{0.8}N$ to the length of 2 nm on light absorbing region 12a.

Then, intensity of molecular beams of metal Ga and metal In was adjusted again to form a columnar crystal of $In_{0.1}Ga_{0.9}N$, that is, the same composition as light absorbing region 12a, to the length of 20 nm on light emitting region 13. The columnar crystal region corresponds to light absorbing region 12b.

By the crystal growth described above, phosphor 1 was formed. Thereafter, substrate 10 having phosphor 1 formed thereon was taken out from the molecular epitaxy apparatus and dipped in a solution containing HF, so as to eliminate by etching dielectric film 11 of $SiO_2$, and phosphor 1 was removed from substrate 10.

When phosphor 1 was irradiated with a blue LD light source having the wavelength of 405 nm, light was absorbed by absorbing regions 12a and 12b, of which energy was transferred to light emitting region 13 and caused emission of blue light having the wavelength of 430 nm.

SECOND EXAMPLE

A phosphor 1 of the present invention was formed in the similar manner as in the first example except that Si was added as an impurity when light emitting region 13 was grown.

When phosphor 1 was irradiated with a blue LD light source having the wavelength of 405 nm, the energy transferred from absorbing region 12a to light emitting region 13 caused emission through impurity level of Si, resulting in emission of blue light having the wavelength of 450 nm. Luminous efficiency was improved by 40% from the first example.

THIRD EXAMPLE

A phosphor 1 of the present invention was formed in the similar manner as in the first example except that Tb was added as an impurity when light emitting region 13 was grown.

Then, as in the first example, when phosphor 1 was irradiated with a blue LD light source having the wavelength of 405 nm, the energy transferred from absorbing region 12a to light emitting region 13 caused emission by inner shell transition corresponding to the f orbit of Tb, resulting in emission of green light having the wavelength of 543 nm.

FOURTH EXAMPLE

A phosphor 1 of the present invention was formed in the similar manner as in the third example except that Tb and Sm were added when light absorbing regions 12a and 12b were grown.

Thereafter, similar to the first example, when phosphor 1 was irradiated with a blue LD light source having the wavelength of 405 nm, absorption of light was promoted by Sm added to absorbing regions 12a and 12b, and the energy transferred from Sm to light emitting region 13 caused emission by inner shell transition corresponding to the f orbit of Tb, resulting in emission of green light having the wavelength of 543 nm.

Further, as compared with the phosphor in accordance with the third example in which Sm was not added to the light absorbing region, emission intensity was improved by 1.4 times.

FIFTH EXAMPLE

By repeating alternate growth of light emitting region 13 and light absorbing region 12 described in the first example, a phosphor having a plurality of light emitting regions such as shown in FIG. 2 was formed. Except for this point, phosphor 1 of the present invention was formed in the similar manner as in the first example.

Specifically, phosphor 1 of the present example has three light emitting regions 3a, 3b and 3c, having impurities Tb, Eu and Si added respectively.

When phosphor 1 was irradiated with a blue LD light source having the wavelength of 405 nm, light emitting regions 3a, 3b and 3c emitted green, red and blue light beams respectively, which were mixed to be observed as white light. Intensity and colors of emission were the same even when the order of forming light emitting regions 3a, 3b and 3c was changed.

SIXTH EXAMPLE

In the fifth example above, the step of removing phosphor 1 from substrate 10 was omitted, and columnar phosphors 1 were left fixed vertically on substrate 10. On a surface of substrate 10 opposite to the surface having phosphors 1 fixed thereon, an Al film having the thickness of 500 nm was deposited, as a light reflecting plate 23.

Thereafter, as shown in FIG. 4, a laser beam of blue semiconductor laser device 25 having the wavelength of 405 nm was introduced from a side surface of substrate 10 through a coupling lens 26.

The laser beam is transmitted laterally in substrate 10 and reflected vertically by light reflecting plate 23, and entered phosphor 1, resulting in white light emission.

In the light emitting device in accordance with the present example, light is emitted from a nano-size columnar phosphor, which attains remarkable quantum size effect. Therefore, luminous efficiency is improved than a phosphor formed to have a planar shape.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A phosphor formed of a columnar crystal having a diameter of at most 3 nm, wherein a light emitting region and a light absorbing region are defined in the columnar crystal, and said light emitting region and the light absorbing region are adjacent to each other along a longitudinal direction of said columnar crystal.

2. The phosphor according to claim 1, wherein said light emitting region has a length of at most 3 nm.

3. The phosphor according to claim 1, wherein said light emitting region is positioned between said light absorbing regions.

4. The phosphor according to claim 1, comprising two or more said light emitting regions.

5. The phosphor according to claim 1, wherein said light emitting region includes a light emitting region of red, a light emitting region of green and a light emitting region of blue, and provides white light as a whole as red, green and blue are mixed.

6. The phosphor according to claim 1, wherein said columnar crystal includes a III group nitride, and said crystal has wurtzeit structure.

7. The phosphor according to claim 1, wherein a plane including the diameter of said columnar crystal is (0001) plane, and the longitudinal direction is <0001> direction.

8. The phosphor according to claim 1, wherein a luminescence center is added to said light emitting region.

9. The phosphor according to claim 8, wherein said luminescence center is a rare earth element.

10. The phosphor according to claim 1, wherein an element that controls light absorption is added to said absorbing region.

11. A method of manufacturing a phosphor formed of a columnar crystal in accordance with claim 1, comprising the steps of:
   forming a dielectric thin film on a substrate;
   growing a phosphor of columnar crystal on the dielectric thin film; and
   removing said phosphor of columnar crystal from said substrate by etching.

12. The method of manufacturing a phosphor according to claim 11, wherein said dielectric film is silicon nitride or silicon oxide.

* * * * *